(12) United States Patent
Wojcik et al.

(10) Patent No.: US 11,735,980 B2
(45) Date of Patent: Aug. 22, 2023

(54) ANTI-ROTATION FEATURE FOR BONDED STUD

(71) Applicant: Hamilton Sundstrand Corporation, Charlotte, NC (US)

(72) Inventors: Craig J. Wojcik, Evansville, WI (US); Andrew P. Grosskopf, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 232 days.

(21) Appl. No.: 17/136,534

(22) Filed: Dec. 29, 2020

(65) Prior Publication Data

US 2022/0209630 A1 Jun. 30, 2022

(51) Int. Cl.
| | |
|---|---|
| H01L 25/03 | (2006.01) |
| H02K 11/042 | (2016.01) |
| H02K 5/04 | (2006.01) |
| H02K 5/20 | (2006.01) |
| H01L 27/08 | (2006.01) |
| H01L 29/66 | (2006.01) |
| H01L 29/861 | (2006.01) |
| H02K 7/00 | (2006.01) |

(52) U.S. Cl.
CPC ............ *H02K 11/042* (2013.01); *H01L 25/03* (2013.01); *H01L 27/0814* (2013.01); *H01L 29/6603* (2013.01); *H01L 29/6609* (2013.01); *H01L 29/861* (2013.01); *H02K 5/04* (2013.01); *H02K 5/20* (2013.01); *H02K 7/003* (2013.01)

(58) Field of Classification Search
CPC . H01L 25/03; H01L 27/0814; H01L 29/6603; H01L 29/6609; H01L 29/861; H02K 11/042; H02K 7/003; H02K 5/04; H02K 5/20

USPC ......................................................... 257/121
See application file for complete search history.

(56) References Cited

U.S. PATENT DOCUMENTS

| | | | | |
|---|---|---|---|---|
| 4,603,344 A | * | 7/1986 | Trommer | H01L 25/112 361/744 |
| 4,621,210 A | | 11/1986 | Krinickas, Jr. | |
| 4,628,219 A | * | 12/1986 | Troscinski | H01L 25/074 363/145 |

(Continued)

OTHER PUBLICATIONS

Extended European Search Report dated May 30, 2022, issued during the prosecution of European Patent Application No. EP 21217839.6.

*Primary Examiner* — Michael Andrews
(74) *Attorney, Agent, or Firm* — Locke Lord LLP; Joshua L. Jones; Scott D. Wofsy

(57) ABSTRACT

A diode pack comprises a plurality of diodes seated in an assembly within a housing. The diode pack also includes a plurality of radial studs extending from an axial end of the housing relative to an axis of rotation extending through the housing. Each of the radial studs is electrically connected to a respective diode within the assembly. The diode pack further includes a center stud captured within the housing between the assembly and the housing and along the axis of rotation. A method of making a diode pack includes forming a housing of an electrically insulate material, removing a portion of the housing along an axis of rotation of the housing, mounting a center stud in the housing where the portion was removed, and assembling an assembly of diodes into the housing.

10 Claims, 5 Drawing Sheets

(56) References Cited

U.S. PATENT DOCUMENTS

| | | | |
|---|---|---|---|
| 4,827,165 A | 5/1989 | Nold | |
| 5,065,484 A | 11/1991 | Pinchott | |
| 5,138,210 A * | 8/1992 | Crickmore | H01L 25/112 |
| | | | 310/68 D |
| 2016/0211713 A1* | 7/2016 | Patel | H02K 3/30 |
| 2016/0380509 A1* | 12/2016 | Crites | H02K 5/04 |
| | | | 310/68 B |
| 2018/0316248 A1* | 11/2018 | Patel | H02K 11/042 |

* cited by examiner

ANTI-ROTATION FEATURE FOR BONDED STUD

BACKGROUND

1. Field

The present disclosure relates to diode packs for electrical machines, and more particularly to anti-rotation features for studs in diode packs.

2. Description of Related Art

Diode packs for electrical machines such as generators, motors, and motor/generators include conductive studs. For example, there may be five radial studs and one center stud for electrical connection between the diodes within the diode pack and external devices. It has been typical to mold the center stud and radial studs into a polymeric pack housing, so that polymer of the housing insulates the radial studs from the center stud. This has generally been sufficient for its intended purpose; however, there is a limit in this technique to certain form factors wherein the gap between the center stud and radial studs is too small for an adequate amount of polymer to flow there between during the molding process.

The conventional techniques have been considered satisfactory for their intended purpose. However, there is an ever present need for improved systems and methods for providing anti-rotation features in a diode pack while maintaining smaller housing form factors. This disclosure provides a solution for this need.

SUMMARY

A diode pack comprises a plurality of diodes seated in an assembly within a housing. The diode pack also includes a plurality of radial studs extending from an axial end of the housing relative to an axis of rotation extending through the housing. Each of the radial studs is electrically connected to a respective diode within the assembly. The diode pack further includes a center stud captured within the housing between the assembly and the housing and along the axis of rotation. The center stud is electrically connected to the assembly as an electrical contact for the assembly. The housing electrically insulates between the center stud and each of the radial studs.

A layer of adhesive can separate between the housing and the center stud. The diode pack can also include at least one Bellville washer within the housing, biasing the center stud in an axial direction against the housing. The diode pack can include a through tube in an axial end of the housing opposite the center stud and radial studs. The through tube can include a fluid passage in fluid communication with an interior space of the housing for flow of coolant in thermal contact with the assembly. The center stud can include a plurality of inlet openings for communication of fluid between the interior space and an interior flow passage of the center stud. The center stud can also include a plurality of outlet openings in fluid communication with at least one fluid passage extending radially through the housing for communication of fluid between the interior flow passage of the center stud and an exterior of the housing.

The diode pack can include an end plate mounted to the axial end of the housing proximate the radial and center studs and additionally can include a sleeve seated about the housing, sealed to the housing by a plurality of O-rings. The housing can be operatively connected to a rotor shaft of an electrical machine. An axial end of the center stud can be captured in a double D-shaped feature defined in the axial end of the housing to prevent relative rotation of the housing and the center stud.

A method of making a diode pack includes forming a housing of an electrically insulate material, removing a portion of the housing along an axis of rotation of the housing, mounting a center stud in the housing where the portion was removed, and assembling an assembly of diodes into the housing.

In the method, mounting the center stud in the housing can include using an adhesive at least temporarily to hold the center stud in place during assembly. Further, mounting the center stud in the housing can also include capturing the center stud axially between the housing and the assembly of diodes. Mounting the center stud in the housing can include capturing the center stud circumferentially with a double-D shaped feature defined in the an axial end of the housing to prevent relative rotation of the housing and the center stud. In the method, forming a housing can include molding the housing. Forming the housing can include molding a plurality of radial studs in an axial end of the housing.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
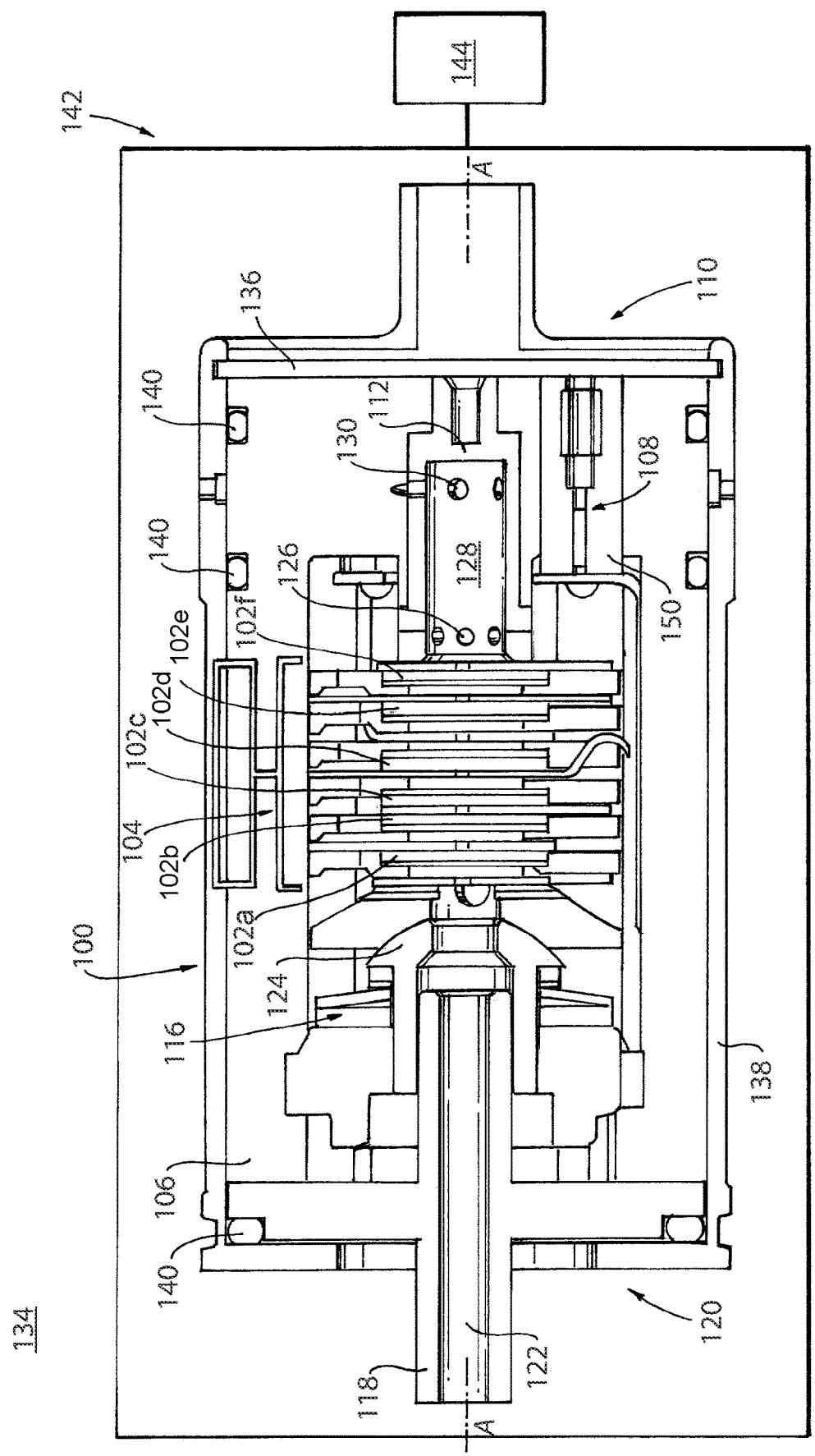
FIG. 1 is a schematic cross-sectional side-elevation view of an embodiment of a diode pack for use in an electrical machine constructed in accordance with the present disclosure.
Figure 2:
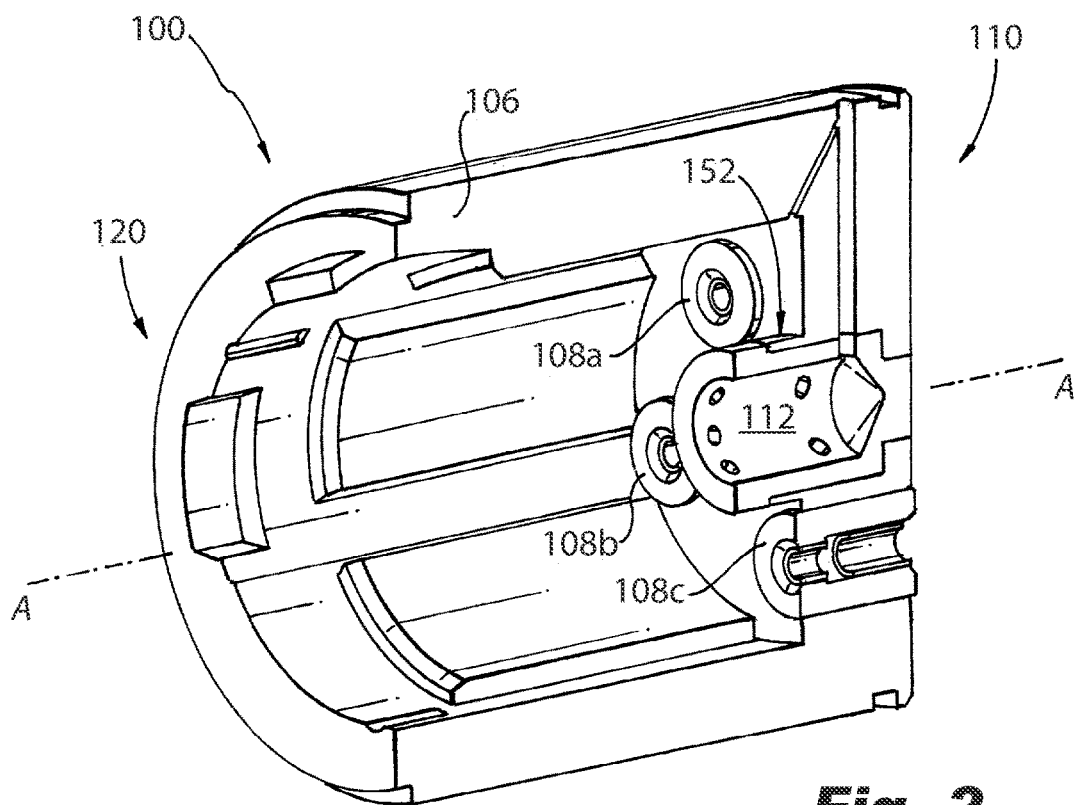
FIG. 2 is a cross-sectional perspective view of the diode pack of FIG. 1 showing an interior of the housing.

Reference will now be made to the drawings wherein like reference numerals identify similar structural features or aspects of the subject disclosure. For purposes of explanation and illustration, and not limitation, a side cross-sectional view an embodiment of a diode pack in accordance with the disclosure is shown in FIG. 1 and is designated generally by reference character 100. Other embodiments of systems in accordance with the disclosure, or aspects thereof, are provided in FIGS. 2-6, as will be described. The systems and methods described herein can be used to provide anti-rotation features within a diode pack when used in an electrical machine.

Shown in FIG. 1, a diode pack 100 comprises a plurality of diodes 102 seated in an assembly 104 within a housing 106. The diode assembly 104 can include at least one diode 102, or six diodes 102 as shown, however any suitable number of diodes 102 can be included in the diode assembly 104. The diode pack 100 can include at least one radial stud 108, or a plurality of radial studs 108 as shown. The total number of radial studs 108 can include five radial studs 108 a,b,c,d,e, however any suitable number may be used. The radial studs 108 can extend from an axial end 110 of the housing 106 relative to an axis of rotation A, where the axis of rotation A extends through the housing 106.

Figure 5:
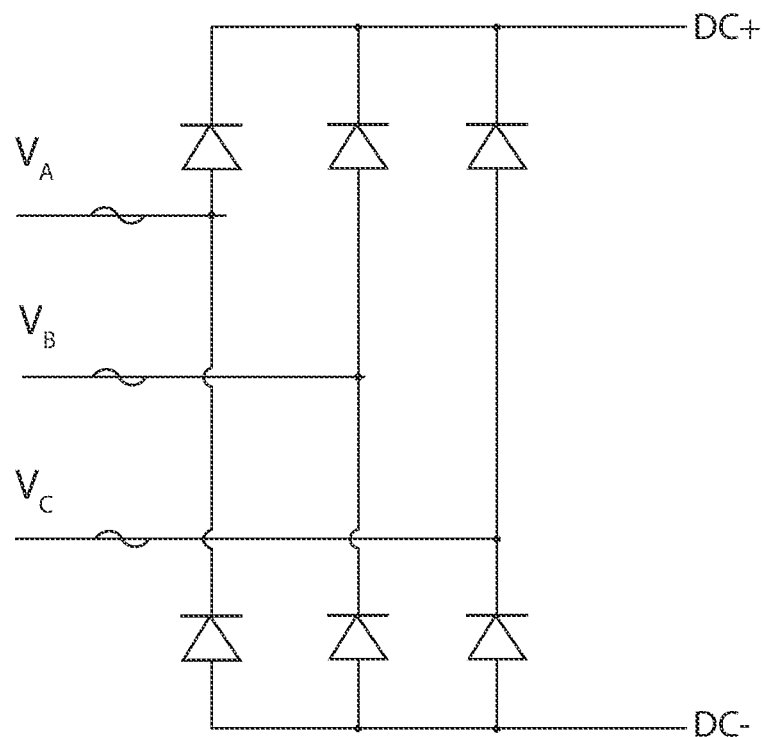
FIG. 5 is schematic circuit diagram showing the electrical connections within the diode pack of FIG. 1.

Each of the radial studs 108 can be electrically connected to a respective diode 102a,b,c,d,e,f within the assembly 104. For example, bushings 150 can provide the electrical contacts between the radial studs 108 and respective diodes 102. The diode pack 100 can also include a center stud 112 captured within the housing 106 between the diode assembly 104 and the housing 106 and along the axis of rotation A. The center stud 112 can also be electrically connected to the diode assembly 104 as an electrical contact for the diode assembly 104. A non-conductive barrier 152 (e.g. labeled in FIG. 2) and the housing 106 electrically insulates between the center stud 112 and each of the radial studs 108, providing the necessary dielectric clearance between electrical components. FIG. 5 provides a schematic circuit diagram showing the electrical connection of the diodes 102a,b,c,d,e,f, within the diode assembly 104.

Still with reference to FIG. 1, the diode pack 100 can also include at least one Bellville washer 116 within the housing 106. The Bellville washer 116 is placed so as to bias the center stud 112 in an axial direction (e.g. along axis A) against the housing 106. The diode pack 100 can include a through tube 118 in an axial end 120 of the housing opposite the center stud 112 and radial studs 108. The through tube 118 can include a fluid passage 122 in fluid communication with an interior space 124 of the housing 106. In operation, the through tube 118 allows flow of coolant to flow through the fluid passage 122 and into the interior space 124 of the housing 106 and in thermal contact with the diode assembly 104.

The diode pack 100 can include an end plate 136 mounted to the axial end 110 of the housing 106 proximate the radial and center studs 108, 112 and additionally can include a sleeve 138 seated about the housing 106. The sleeve 138 can be sealed to the housing 106 by a plurality of O-rings 140 as shown, or by any other suitable method.

Figure 3:
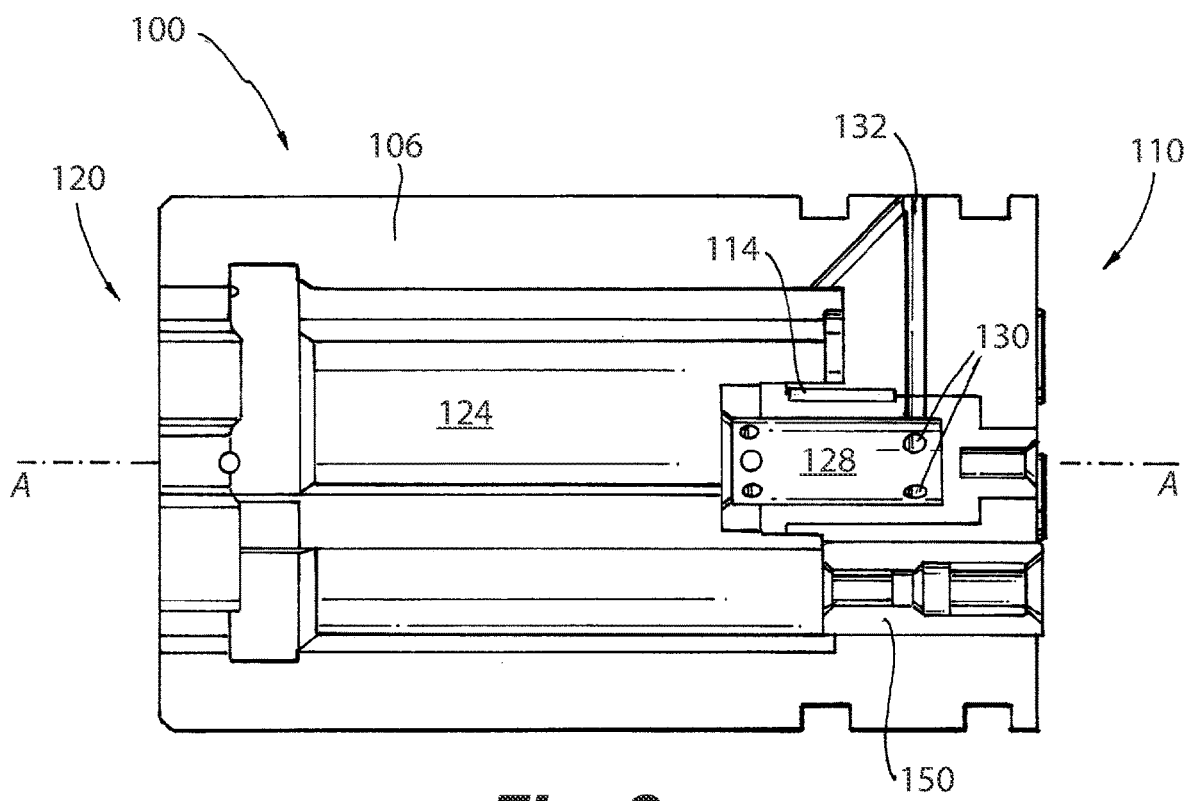
FIG. 3 is a schematic cross-sectional side-elevation view of the diode pack of FIG. 1 showing an anti-rotation feature.

As shown in FIGS. 1 and 3, the center stud 112 can include a plurality of inlet openings 126 for communication of fluid between the interior space 124 and an interior flow passage 128 of the center stud 112. The center stud 112 can also include a plurality of outlet openings 130 in fluid communication with at least one fluid passage 132 extending radially through the housing 106 for communication of fluid between the interior flow passage 128 of the center stud 112 and an exterior of the housing 134. As shown, the inlet openings 126 and outlet openings 130 are placed circumferentially around the center stud 112. However, any suitable placement of the inlet and outlet openings 126, 130 can be used, as well as any suitable number of inlet and outlet openings 126, 130.

Figure 4:
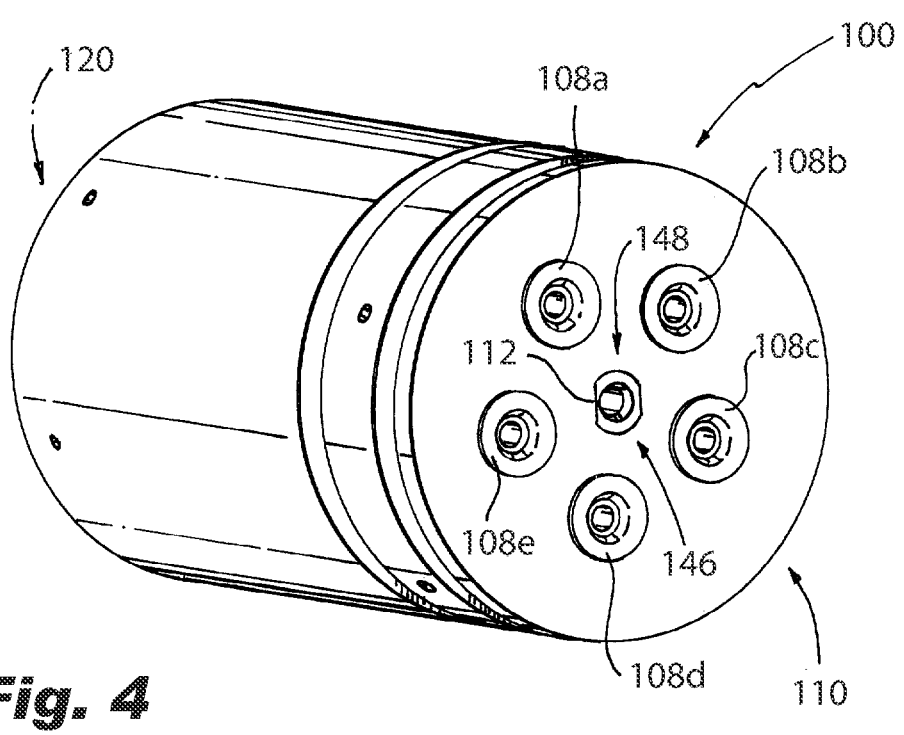
FIG. 4 is a perspective view of the diode pack of FIG. 1, showing the double D-shaped feature.

In embodiments, the housing 106 can be operatively connected to a rotor shaft 142 of an electrical machine 144, for example as shown schematically in FIG. 1. A layer of adhesive 114 can separate between the housing 106 and the center stud 112 (e.g. as shown in FIG. 3). For example, as described in more detail with respect to the method 200, the radial stud 112 may be inserted into the housing 106 with an adhesive layer 114 to prohibit rotation of housing 106 and center stud 112 when connected to an electrical machine. However, it is possible that the adhesive layer 114 may fail, thus additional anti-rotation features may be included, such as a double-D shaped feature 148. As best seen in FIG. 4, an axial end 146 of the center stud 112 can be captured in a double D-shaped feature 148. The double-D shaped feature 148 can be defined in the axial end 110 of the housing 106 to prevent relative rotation of the housing 106 and the center stud 112.

Figure 6:
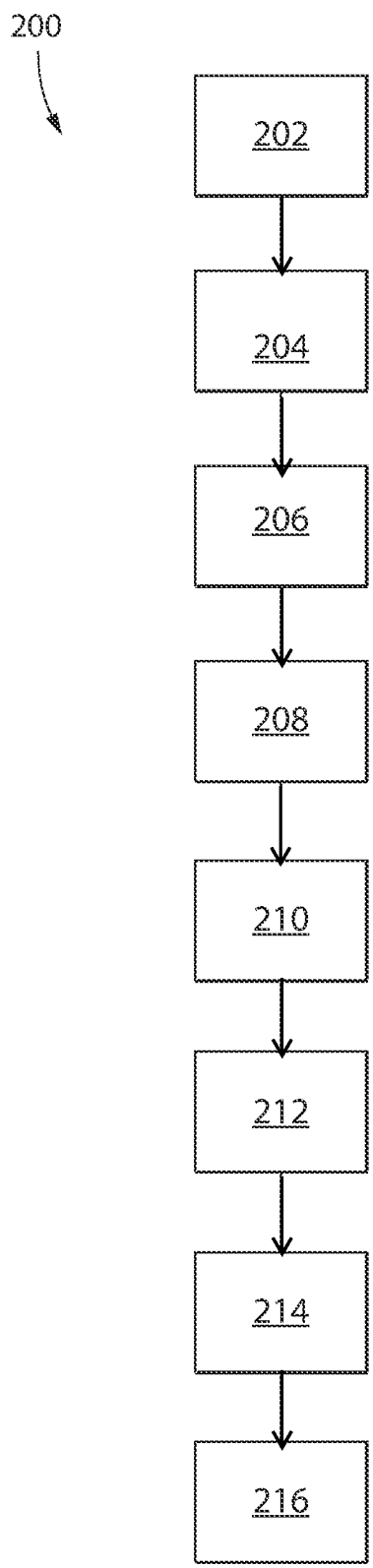
FIG. 6 is a block diagram, showing a method for forming a diode pack in accordance with at least one aspect of this disclosure.

Turning to FIG. 6, a method 200 of making a diode pack (e.g. diode pack 100 as described herein) includes, e.g. at box 202, forming a housing 106 of an electrically insulate material. The electrically insulate material can be any suitable non-conductive material as appreciated by those skilled in the art. In embodiments, forming the housing 106 can include molding (e.g. injection molding) the housing 106, such as shown at box 204, and forming the housing 106 can include molding a plurality of radial studs 108 in an axial end 110 of the housing 106, such as shown at box 206. At box 208, the method 200 can include removing (e.g. via machining) a portion of the housing 106 along an axis of rotation A of the housing 106. As shown at box 210, the method 200 can include mounting a center stud 112 in the housing 106 where the portion was removed. Further, the method 200 can also include assembling an assembly of diodes 104 into the housing 106, shown at box 212.

In embodiments, mounting the center stud 112 in the housing 106 (e.g. box 212) can optionally include using an adhesive 114 at least temporarily to hold the center stud 112 in place during assembly, such as that shown at box 214. Further, mounting the center stud 112 in the housing 106 can also include capturing the center stud 112 axially between the housing 106 and the assembly of diodes 104, e.g. as shown at box 216. In further embodiments, mounting the center stud 112 in the housing 106 can include capturing the center stud 112 circumferentially with a double-D shaped feature 148, e.g. shown at box 218. As described above, the double-D shaped feature 148 can be defined in an axial end 110 of the housing 106 to prevent relative rotation of the housing 106 and the center stud 112.

The methods and systems of the present disclosure, as described above and shown in the drawings, removes the previous limitations on form factor between the radial studs and a center stud. Doing so provides for smaller housing form factors in diode packs. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A diode pack comprising:
   a plurality of diodes seated in an assembly within a housing;
   a plurality of radial studs extending from an axial end of the housing relative to an axis of rotation extending through the housing, wherein each of the radial studs is electrically connected to a respective diode within the assembly; and
   a center stud captured within the housing between the assembly and the housing, along the axis of rotation, wherein the center stud is electrically connected to the assembly as an electrical contact for the assembly, and wherein the housing electrically insulates between the center stud and each of the radial studs, wherein the plurality of radial studs and the center stud are all on one axial end of the housing.

2. The diode pack as recited in claim 1, wherein a layer of adhesive separates between the housing and the center stud.

3. The diode pack as recited in claim 1, further comprising at least one Bellville washer within the housing, biasing the center stud in an axial direction against the housing.

4. The diode pack as recited in claim 1, further comprising a through tube in an axial end of the housing opposite the center stud and radial studs, wherein the tube includes a fluid passage in fluid communication with an interior space of the housing for flow of coolant in thermal contact with the assembly.

5. The diode pack as recited in claim 4, wherein the center stud includes a plurality of inlet openings for communication of fluid between the interior space and an interior flow passage of the center stud.

6. The diode pack as recited in claim 5, wherein the center stud includes a plurality of outlet openings in fluid communication with at least one fluid passage extending radially through the housing for communication of fluid between the interior flow passage of the center stud and an exterior of the housing.

7. The diode pack as recited in claim 1, further comprising an end plate mounted to the axial end of the housing proximate the radial and center studs.

8. The diode pack as recited in claim 1, further comprising a sleeve seated about the housing, sealed to the housing by a plurality of o-rings.

9. The diode pack as recited in claim 1, wherein the housing is operatively connected to a rotor shaft of an electrical machine.

10. The diode back as recited in claim 1, wherein an axial end of the center stud is captured in a double D-shaped feature defined in the axial end of the housing to prevent relative rotation of the housing and the center stud.

\* \* \* \* \*